United States Patent
Tsai

(10) Patent No.: US 10,571,203 B2
(45) Date of Patent: Feb. 25, 2020

(54) LIQUID COOLING BLOCK WITH SHUNT DESIGN AND HEAT DISSIPATING STRUCTURE THEREOF

(71) Applicant: COOLER MASTER CO., LTD., New Taipei (TW)

(72) Inventor: Shui-Fa Tsai, New Taipei (TW)

(73) Assignee: COOLER MASTER CO., LTD., New Taipei (TW)

(*) Notice: Subject to any disclaimer, the term of this patent is extended or adjusted under 35 U.S.C. 154(b) by 189 days.

(21) Appl. No.: 14/928,388

(22) Filed: Oct. 30, 2015

(65) Prior Publication Data

US 2017/0045307 A1    Feb. 16, 2017

(30) Foreign Application Priority Data

Aug. 11, 2015  (TW) ............................. 104212921 U

(51) Int. Cl.
| | |
|---|---|
| *F28F 3/02* | (2006.01) |
| *F28F 3/12* | (2006.01) |
| *H01L 23/473* | (2006.01) |
| *F28F 13/06* | (2006.01) |
| *H01L 23/467* | (2006.01) |

(52) U.S. Cl.
CPC ................. *F28F 3/02* (2013.01); *F28F 3/12* (2013.01); *F28F 13/06* (2013.01); *H01L 23/467* (2013.01); *H01L 23/473* (2013.01); *H01L 23/4735* (2013.01); *H01L 2924/0002* (2013.01)

(58) Field of Classification Search
CPC .......................... H01L 23/4735; H01L 23/473
See application file for complete search history.

(56) References Cited

U.S. PATENT DOCUMENTS

| | | | | |
|---|---|---|---|---|
| 2003/0221816 | A1* | 12/2003 | Ellsworth, Jr. ........ | H01L 23/367 165/80.3 |
| 2008/0216991 | A1* | 9/2008 | Oikawa ..................... | G06F 1/20 165/80.3 |
| 2012/0175094 | A1* | 7/2012 | Rice .......................... | F28D 1/03 165/170 |
| 2013/0292105 | A1* | 11/2013 | Salamon ............. | H01L 23/3672 165/185 |
| 2014/0293542 | A1* | 10/2014 | Vetrovec ............... | H01L 23/473 361/699 |

* cited by examiner

*Primary Examiner* — Larry L Furdge
*Assistant Examiner* — Nael N Babaa
(74) *Attorney, Agent, or Firm* — Maschoff Brennan

(57) ABSTRACT

Disclosed are a liquid cooling block with a shunt design and its heat dissipating structure. The liquid cooling block includes a base plate, a cover plate, and a heat dissipating structure, and the cover plate includes a liquid inlet and a liquid outlet for a working fluid flowing in a chamber, and the heat dissipating structure is disposed between the liquid inlet and the liquid outlet and includes plural fins arranged separately with one another and in a direction from the liquid inlet towards the liquid outlet, and a shunt part connected between the fins and protruded from the fins, and a flow channel is formed between any two adjacent fins, so that a working fluid can pass through the liquid inlet and be divided by the shunt part to flow into the flow channel of the fins.

13 Claims, 6 Drawing Sheets

LIQUID COOLING BLOCK WITH SHUNT DESIGN AND HEAT DISSIPATING STRUCTURE THEREOF

FIELD OF THE INVENTION

The technical field relates to a liquid cooling system, more particularly to a liquid cooling block with a shunt design and its heat dissipating structure.

BACKGROUND OF THE INVENTION

In general, a conventional liquid cooling system is formed by connecting a plurality of pipelines with a liquid cooling block, a pump, a cooling module (such as a liquid cooling rack) and a storage tank, and the liquid cooling block is in contact with a heat generating component for dissipating the heat generated by the heat generating component, and the internal structure of the liquid cooling block includes a hollow chamber containing a plurality of fins installed therein and provided for assisting the liquid cooling block to absorb the heat generated by the heat generating component quickly, and dissipating the heat by a working liquid that flows in the chamber, so as to achieve the heat dissipation effect.

However, the working fluid flows rapidly in the liquid cooling block, so that the working fluid is always discharged out of the liquid cooling block before having a good heat exchange in the chamber. As a result, the heat exchange efficiency is low.

In view of the aforementioned problem, the discloser of this disclosure based on years of experience in the industry to conduct extensive researches and experiments and finally provided a feasible solution to overcome the problem of the prior art effectively.

SUMMARY OF THE INVENTION

It is a primary objective of this disclosure to provide a liquid cooling block with a shunt design and its heat dissipating structure to extend the time for a working fluid to stay in the liquid cooling block while filling the working fluid in the liquid cooling block by a shunt method to improve the heat exchange efficiency.

To achieve the aforementioned and other objectives, this disclosure provides a liquid cooling block with a shunt design, having a heat exchange portion provided for contacting a heat generating component, and comprising: a base plate having the heat exchange portion, a cover plate installed on the base plate, wherein a hollow chamber is formed between the cover plate and the base plate, and a heat dissipating structure installed on the base plate and disposed in the chamber, wherein the cover plate has a liquid inlet and a liquid outlet for a working fluid flowing in the chamber, and the heat dissipating structure is disposed at a position between the liquid inlet and the liquid outlet and includes a plurality of fins arranged separately with one another and in a direction from the liquid inlet towards the liquid outlet, and a shunt part connected between at least some of the fins and protruded from at least some of the fins, and a flow channel is formed between any two adjacent fins and configured to be corresponsive to the heat exchange portion, such that a working fluid can pass through the liquid inlet and be divided by the shunt part to flow into at least some of the flow channels.

To achieve the aforementioned and other objectives, this disclosure provides a heat dissipating structure, comprising: a plurality of fins, and a shunt part installed and connected between at least some of the fins, wherein the fins are sequentially arranged in a predetermined direction and a flow channel is formed between any two adjacent fins, and the shunt part is protruded from at least some of the fins, such that a working fluid is divided by the shunt part to flow into at least some of the flow channels.

DESCRIPTION OF THE PREFERRED EMBODIMENTS

The technical contents of this disclosure will become apparent with the detailed description of preferred embodiments accompanied with the illustration of related drawings as follows. It is intended that the embodiments and figures disclosed herein are to be considered illustrative rather than restrictive.

Figure 1:
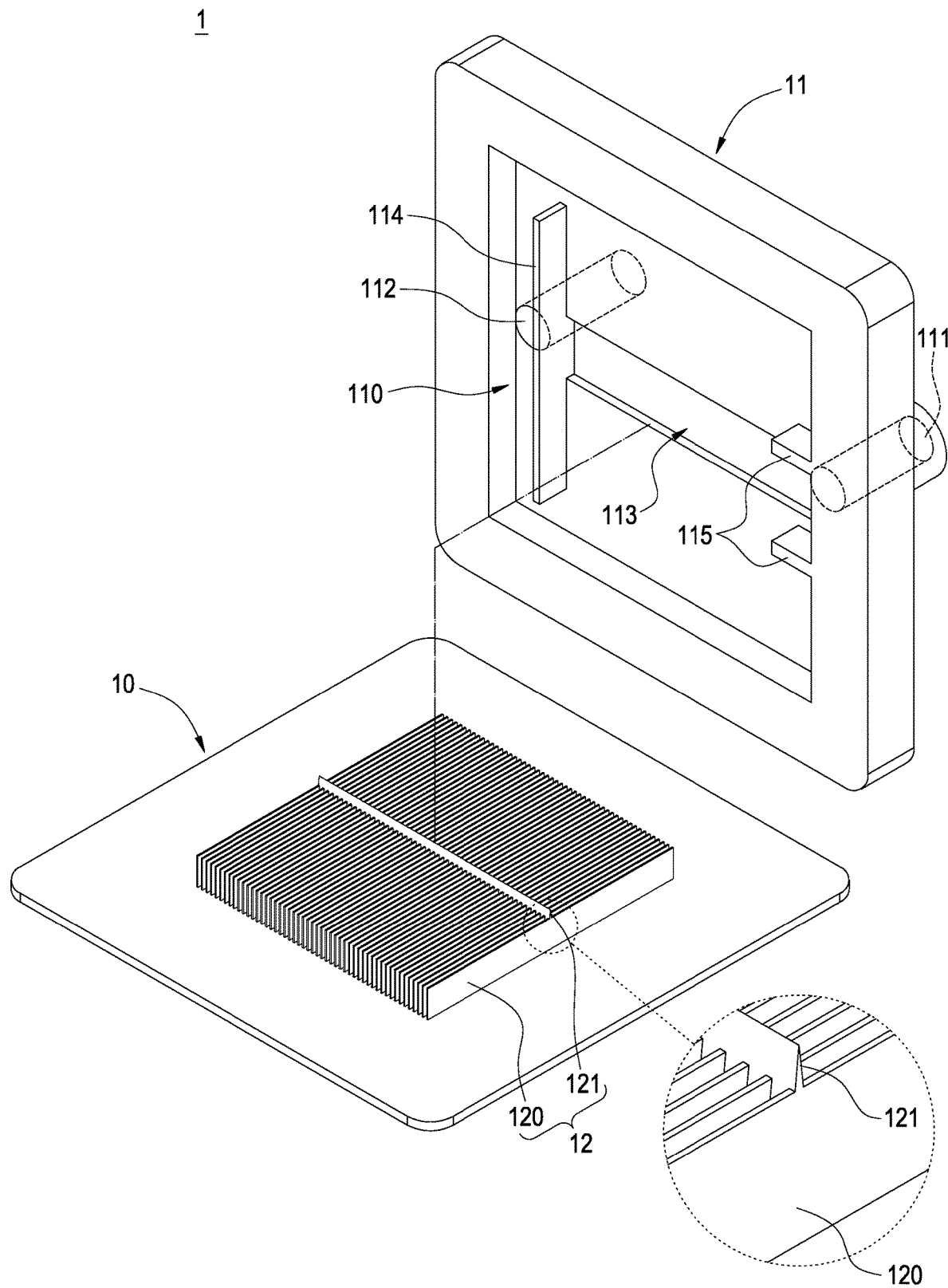
FIG. 1 is an exploded view of a liquid cooling block of this disclosure.
Figure 2:
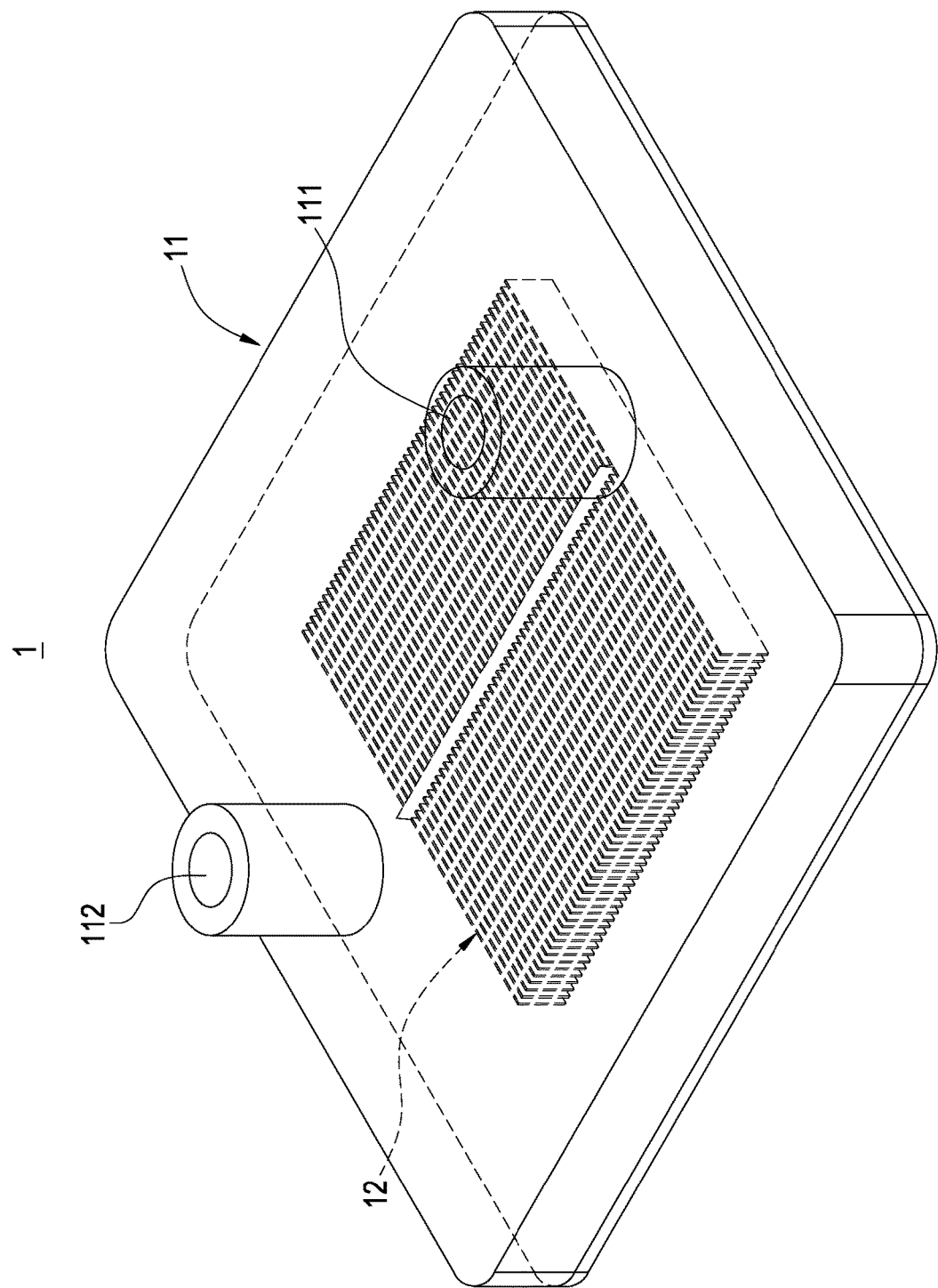
FIG. 2 is a perspective view of a liquid cooling block of this disclosure.
Figure 3:
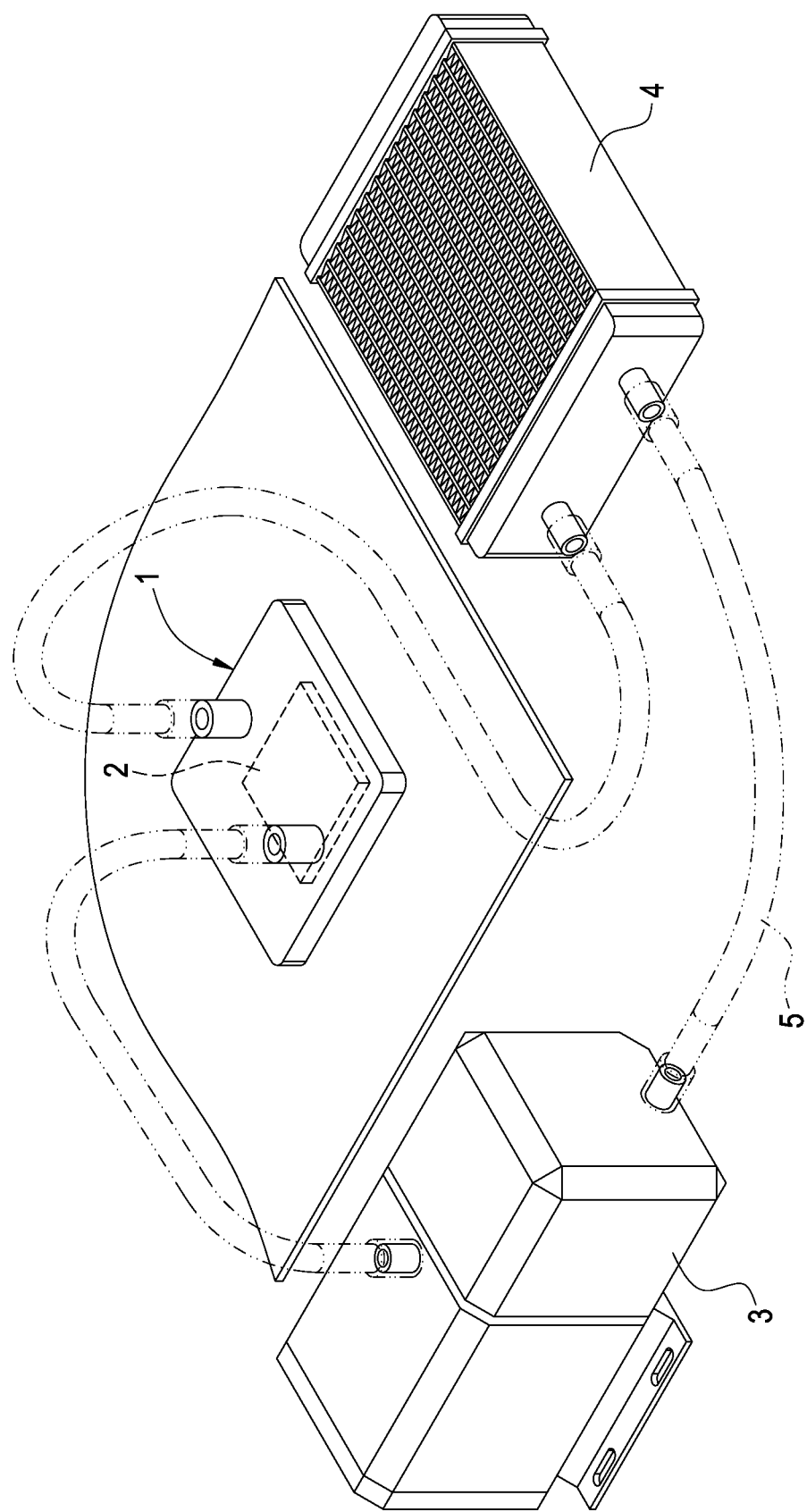
FIG. 3 is a perspective view of a liquid cooling block of this disclosure applied to a liquid cooling system.

With reference to FIGS. 1, 2 and 3 for an exploded view and a perspective view of a liquid cooling block with a shunt design and a schematic view of the liquid cooling block applied in a liquid cooling system in accordance with this disclosure. This disclosure discloses a liquid cooling block with a shunt design and its heat dissipating structure, wherein the liquid cooling block 1 is provided for contacting a heat generating component 2 such as a pump 3 and a cooling module 4, and a liquid cooling system is formed by serially connecting a plurality of pipelines 5 (as shown in FIG. 3). A working fluid (not shown in the figure) is provided in the liquid cooling block 1 for dissipating the heat generated by the heat generating component 2. The liquid cooling block 1 comprises a base plate 10, a cover plate 11, and a heat dissipating structure 12.

Figure 4:
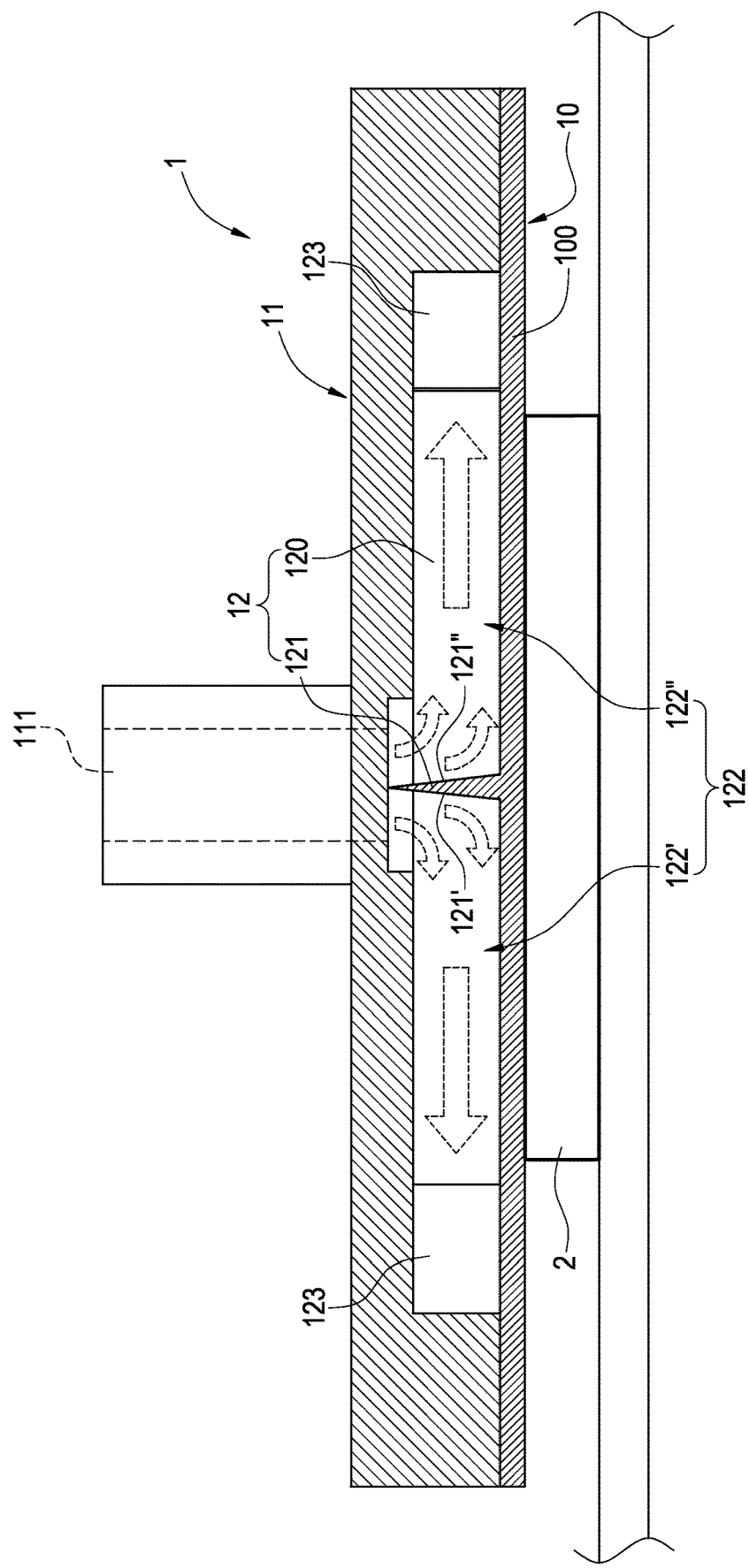
FIG. 4 is a sectional view of a liquid cooling block of this disclosure in contact with a heat generating component.

The base plate 10 is made of a material with good thermal conductivity such as aluminum or copper. In FIG. 4, the base plate 10 is provided for contacting the heat generating component 2, and the base plate 10 has a heat exchange portion 100 configured to be corresponsive to the heat generating component 2. After the heat exchange portion 100 is in contact with the heat generating component 2, the heat generated by the heat generating component 2 is conducted from the heat exchange portion 100 to the liquid cooling block 1.

Figure 5:
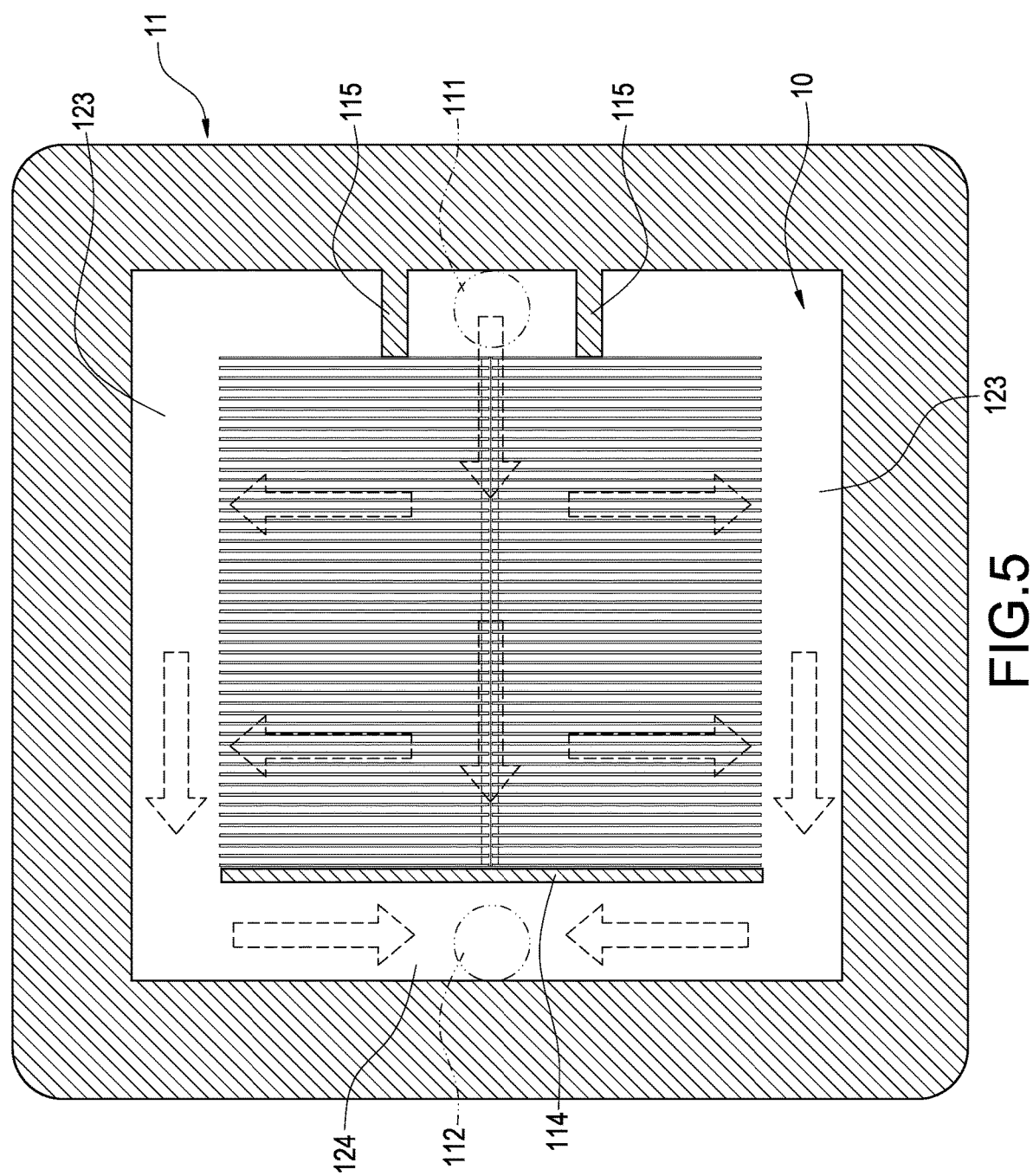
FIG. 5 is a top view showing the internal structure of a liquid cooling block of this disclosure.

The cover plate 11 is substantially a lid installed and covered onto the base plate 10, and a hollow chamber 110 is formed between the cover plate 11 and the base plate 10. In FIGS. 4 and 5, the cover plate 11 has a liquid inlet 111 and a liquid outlet 112. After the pipeline 5 is connected, a working fluid is provided by the liquid cooling block 1 and filled into the chamber 110 through the liquid inlet 111. The working fluid flows in the chamber 110 in a direction as indicated by the arrows in FIGS. 4 and 5, and then flows from the liquid outlet 112 to the outside to dissipate the heat generated by the heat generating component 2 and absorbed by the heat exchange portion 100 of the liquid cooling block 1, so as to achieve the effect of dissipating the heat of the heat generating component 2.

The heat dissipating structure 12 includes a plurality of fins 120, and a shunt part 121 connected between the fins 120. The shunt part 121 may be connected to all fins 120 or just connected to some of the fins 120 and protruded from all or some of the fins 120 and configured to be corresponsive to the liquid inlet 111. The heat dissipating structure 12 is installed on the base plate 10 and disposed in the chamber 110 and at a position between the liquid inlet 111 and the liquid outlet 112, and the fins 120 are sequentially arranged in a predetermined direction. In an embodiment of this disclosure, the fins 120 are arranged separately with one another and in a direction from the liquid inlet 111 towards the liquid outlet 112, and a flow channel 122 is formed between any two adjacent fins 120 and configured to be corresponsive to the heat exchange portion 100 of the base plate 10. In FIGS. 4 and 5, the shunt part 121 is a convex ridge which may be in a pyramidal shape, and provided for dividing the flow channel 122 connected between the fins 120 into a first-side sub flow channel 122' and a second-side sub flow channel 122". The convex ridge further has a first-side bevel 121' and a second-side bevel 121" configured to be corresponsive to the first-side sub flow channel 122' and the second-side sub flow channel 122" respectively, such that after a working fluid passes through the liquid inlet 111, the working fluid is divided by the shunt part 121 to flow into the flow channel 122 of the fins 120. In addition, the shunt part 121 may be disposed at the middle section of the fins 120 (as shown in the figure) or any portion of the fins 120 (not shown in the figure) depending on the position of the liquid inlet 111 situated on the liquid cooling block 1.

With reference to FIGS. 1, 4 and 5 for an embodiment of this disclosure, the cover plate 11 includes a guide groove 113 configured to be corresponsive to the shunt part 121 and extended from the liquid inlet 111 towards the liquid outlet 112, such that after a working fluid passes through the liquid inlet 111, the working fluid may flow along the guide groove 113 and from the top to the bottom of the shunt part 121 to divide the flow. In addition, the cover plate 11 further includes a baffle plate 114 disposed between the heat dissipating structure 12 and the liquid outlet 112. The baffle plate 114 blocks an end of the guide groove 113 to prevent the working fluid from flowing directly from the guide groove 113 towards the liquid outlet 112 without passing through the heat dissipating structure 12. In addition, the cover plate 11 further includes two limiting plates 115 configured to be corresponsive to both sides of the liquid inlet 111 respectively for limiting the working fluid to flow in a direction towards the guide groove 113 after passing through the liquid inlet 111.

With the aforementioned structure, a liquid cooling block with a shunt design and its heat dissipating structure in accordance with this disclosure is formed.

In FIG. 4, when the working fluid is passed through the liquid inlet 111 and filled into the liquid cooling block 1, the working fluid passes through the shunt part 121 of the heat dissipating structure 12 and flows along the shunt part 121, such that the working fluid is divided and flows into the flow channels 122 on the left and the right to dissipate the heat at each fin 120 and the heat exchange portion 100. With the design of the guide groove 113 and the limiting plate 115 as shown in FIG. 5, the working fluid may flow along the guide groove 113 and then the working fluid is evenly distributed to the flow channel 122 between the fins 120 and blocked by the baffle plate 114 to prevent the working fluid from flowing towards the liquid outlet 112 directly. A first convergent flow channel 123 and a second convergent flow channel 124 may be designed in the chamber 110 of the liquid cooling block 1 and around the external periphery of the heat dissipating structure 12, such that when the working fluid flows out from each flow channel 122, the first convergent flow channel 123 converges the working fluids flowing out from both ides of the flow channel 122 and then combines the working fluids from the second convergent flow channel 124 and drives the working fluid to flow towards the liquid outlet 112 and be discharged out of the liquid cooling block 1, and finally the working fluid is cooled by the cooling module 4 of the liquid cooling system.

Figure 6:
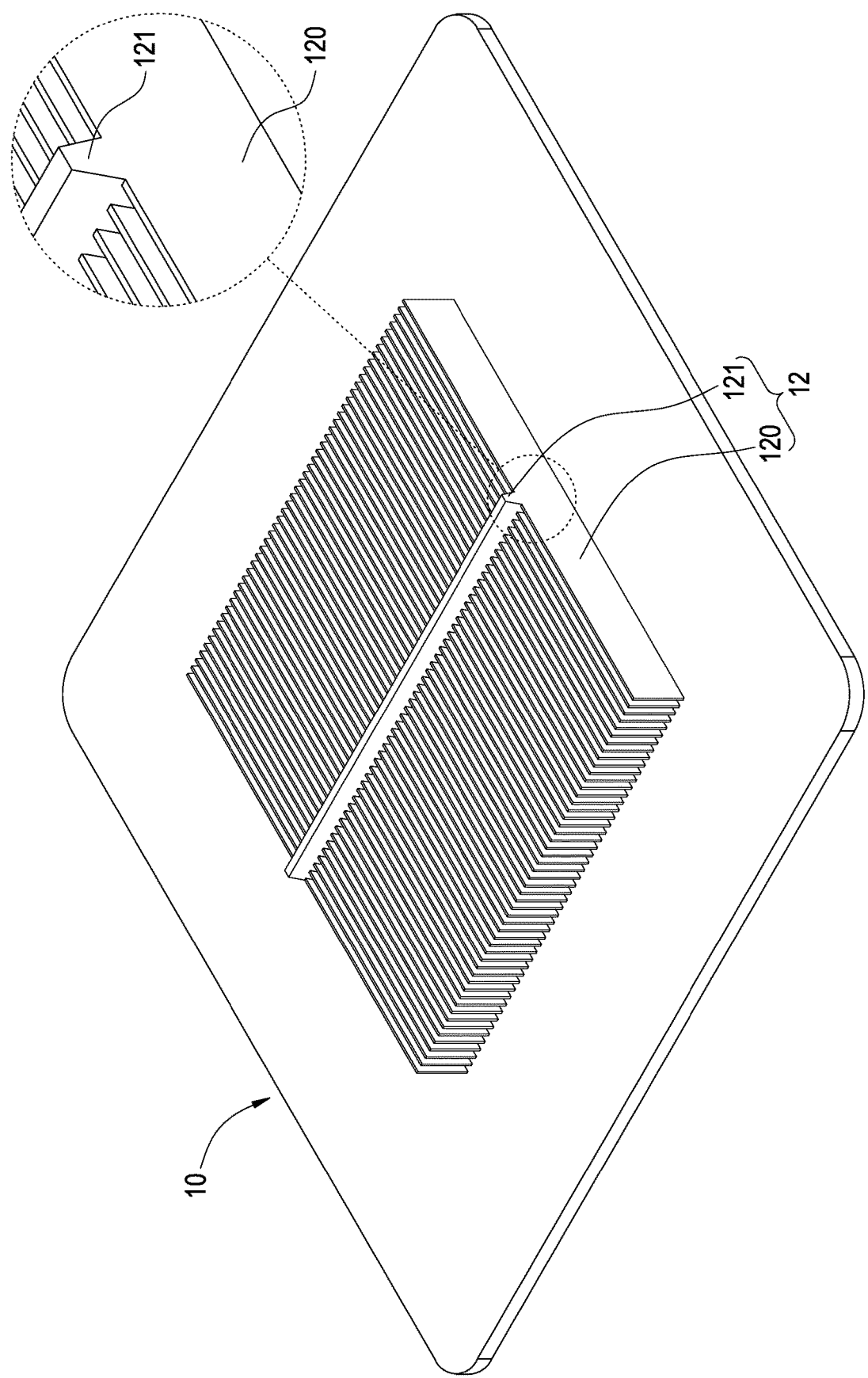
FIG. 6 is a perspective view of another embodiment of a heat dissipating structure of this disclosure.

With reference to FIG. 6 for a perspective view of a heat dissipating structure in accordance with another embodiment of this disclosure, the convex ridge of the shunt part 121 may be in a pyramidal shape (as disclosed in the aforementioned embodiment) or a bar shape (as shown in FIG. 6) or an arc shape (not shown in the figure), so that each fin 120 provides a blocking effect after being connected, so as to achieve the effects of dividing the filled working fluid, extending the time for the working fluid to stay in the heat dissipating structure 12, and improving the heat exchange efficiency.

While this disclosure has been described by means of specific embodiments, numerous modifications and variations could be made thereto by those skilled in the art without departing from the scope and spirit of this disclosure set forth in the claims.

What is claimed is:
1. A liquid cooling block with a shunt design, having a heat exchange portion provided for contacting a heat generating component, and the liquid cooling block comprising:
   a base plate, having the heat exchange portion;
   a cover plate, installed on the base plate, and a hollow chamber being formed between the cover plate and the base plate, and the cover plate having a liquid inlet and a liquid outlet formed thereon for a working fluid flowing in the chamber; and
   a heat dissipating structure, installed on the base plate, and disposed in the chamber and at a position between the liquid inlet and the liquid outlet, and the heat dissipating structure including a plurality of fins arranged separately with one another and in a direction from the liquid inlet towards the liquid outlet, and a shunt part connected between the fins, and the shunt part being along a central axis of the plurality of fins and formed integrally with each of the plurality of fins, and a flow channel being formed between any two adjacent fins in a direction which is different from the direction from the liquid inlet to the liquid outlet and configured to be corresponsive to the heat exchange portion, such that the working fluid is divided by the shunt part to flow into at least some of the flow channels.

2. The liquid cooling block with a shunt design according to claim 1, wherein the cover plate is a lid covered onto the base plate.

3. The liquid cooling block with a shunt design according to claim 2, wherein the cover plate includes a guide groove configured to be corresponsive to the shunt part and extended from the liquid inlet towards the liquid outlet.

4. The liquid cooling block with a shunt design according to claim 3, wherein the cover plate further includes a baffle plate disposed between the heat dissipating structure and the liquid outlet, and the baffle plate blocks an end of the guide groove.

5. The liquid cooling block with a shunt design according to claim 4, wherein the cover plate includes two limiting plates disposed on both sides of the liquid inlet respectively.

6. The liquid cooling block with a shunt design according to claim 1, wherein the shunt part is a convex ridge for dividing the flow channel connected between the fins into a first-side sub flow channel and a second-side sub flow channel, and the convex ridge further has a first-side bevel and a second-side bevel configured to be corresponsive to the first-side sub flow channel and the second-side sub flow channel respectively.

7. The liquid cooling block with a shunt design according to claim 6, wherein the shunt part is a convex ridge in a pyramidal shape, a bar shape or an arc shape.

8. The liquid cooling block with a shunt design according to claim 1, wherein the shunt part of the heat dissipating structure is disposed at the middle or any portion of the fins.

9. A liquid cooling block with a shunt design, having a heat exchange portion provided for contacting a heat generating component, and the liquid cooling block comprising:
- a base plate, having the heat exchange portion;
- a cover plate, installed on the base plate, and a hollow chamber being formed between the cover plate and the base plate, the cover plate having a liquid inlet and a liquid outlet formed thereon for a working fluid flowing in the chamber; and
- a heat dissipating structure, installed on the base plate, and disposed in the chamber and at a position between the liquid inlet and the liquid outlet, and the heat dissipating structure including a plurality of fins arranged separately with one another and in a direction from the liquid inlet towards the liquid outlet, and a shunt part connected between the fins, and the shunt part being along a central axis of the plurality of fins and formed integrally with each of the plurality of fins, and a flow channel being formed between any two adjacent fins and configured to be corresponsive to the heat exchange portion, such that the working fluid is divided by the shunt part to flow into at least some of the flow channels;

wherein the chamber includes a first convergent flow channel and a second convergent flow channel formed therein, the first convergent flow channel is adjacent to and surrounding the heat dissipating structure, the first convergent flow channel is communicated with the flow channel, one end of the flow channel converges into the first convergent flow channel, the second convergent flow channel is communicated with the first convergent flow channel, and configured to be corresponsive to the liquid outlet.

10. A heat dissipating structure, comprising: a plurality of fins, sequentially arranged in a predetermined direction, and having a flow channel formed between any two adjacent fins in a direction which is different from the predetermined direction; and a shunt part, installed and connected between the fins, and along a central axis of the plurality of fins and formed integrally with each of the plurality of fins, and protruded from and formed integrally with the at least some of the fins, such that a working fluid is divided by the shunt part to flow into at least some of the flow channels.

11. The heat dissipating structure according to claim 10, wherein the shunt part is a convex ridge that divides the flow channel connected between the fins into a first-side sub flow channel and a second-side sub flow channel, and the convex ridge further includes a first-side bevel and a second-side bevel corresponsive to the first-side sub flow channel and the second-side sub flow channel respectively.

12. The liquid cooling block with a shunt design according to claim 1, wherein the direction of the flow channel formed between any two adjacent fins is perpendicular to the direction from the liquid inlet to the liquid outlet.

13. The heat dissipating structure according to claim 10, wherein the direction of the flow channel formed between any two adjacent fins is perpendicular to the predetermined direction.

* * * * *